(12) United States Patent
Weiner et al.

(10) Patent No.: US 6,303,446 B1
(45) Date of Patent: Oct. 16, 2001

(54) METHOD OF MAKING SELF-ALIGNED LIGHTLY-DOPED-DRAIN STRUCTURE FOR MOS TRANSISTORS

(75) Inventors: Kurt H. Weiner, San Jose; Paul G. Carey, Mountain View, both of CA (US)

(73) Assignee: The Regents of the University of California, Oakland, CA (US)

( * ) Notice: Subject to any disclaimer, the term of this patent is extended or adjusted under 35 U.S.C. 154(b) by 670 days.

(21) Appl. No.: 08/593,766

(22) Filed: Jan. 29, 1996

(51) Int. Cl.$^7$ ................................................ H01L 21/336
(52) U.S. Cl. ...................... 438/299; 438/301; 438/306; 438/307
(58) Field of Search ........................... 437/44, 173, 174; 438/299, 301, 306–7

(56) References Cited

U.S. PATENT DOCUMENTS

| | | | |
|---|---|---|---|
| 4,151,008 | * | 4/1979 | Kirkpatrick ........................ 219/121 L |
| 4,558,507 | * | 12/1985 | Okabayashi et al. .................. 29/571 |
| 4,621,411 | * | 11/1986 | Havemann et al. .................... 29/571 |
| 4,661,177 | * | 4/1987 | Powell ................................. 148/189 |
| 4,669,176 | * | 6/1987 | Kato ...................................... 29/571 |
| 4,914,500 | * | 4/1990 | Liu et al. .............................. 357/67 |
| 5,012,306 | * | 4/1991 | Tasch, Jr. et al. .................. 357/23.4 |
| 5,114,876 | * | 5/1992 | Weiner ................................ 437/174 |
| 5,316,969 | * | 5/1994 | Ishida et al. ........................ 437/168 |
| 5,346,850 | * | 9/1994 | Kaschmitter et al. ............... 437/173 |
| 5,456,763 | * | 10/1995 | Kaschmitter et al. ............... 437/173 |

* cited by examiner

Primary Examiner—John F. Niebling
Assistant Examiner—Lynne A. Gurley
(74) Attorney, Agent, or Firm—L. E. Carnahan; Alan H. Thompson

(57) ABSTRACT

A process for fabricating lightly-doped-drains (LDD) for short-channel metal oxide semiconductor (MOS) transistors. The process utilizes a pulsed laser process to incorporate the dopants, thus eliminating the prior oxide deposition and etching steps. During the process, the silicon in the source/drain region is melted by the laser energy. Impurities from the gas phase diffuse into the molten silicon to appropriately dope the source/drain regions. By controlling the energy of the laser, a lightly-doped-drain can be formed in one processing step. This is accomplished by first using a single high energy laser pulse to melt the silicon to a significant depth and thus the amount of dopants incorporated into the silicon is small. Furthermore, the dopants incorporated during this step diffuse to the edge of the MOS transistor gate structure. Next, many low energy laser pulses are used to heavily dope the source/drain silicon only in a very shallow region. Because of two-dimensional heat transfer at the MOS transistor gate edge, the low energy pulses are inset from the region initially doped by the high energy pulse. By computer control of the laser energy, the single high energy laser pulse and the subsequent low energy laser pulses are carried out in a single operational step to produce a self-aligned lightly-doped-drain-structure.

18 Claims, 1 Drawing Sheet

METHOD OF MAKING SELF-ALIGNED LIGHTLY-DOPED-DRAIN STRUCTURE FOR MOS TRANSISTORS

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to metal oxide semiconductor (MOS) transistors, particularly to the fabrication of lightly-doped-drain structure of MOS transistors, and more particularly to a process for producing self-aligned lightly-doped-drain structures using pulsed laser energy, thereby simplifying the fabrication of silicon integrated circuits.

As lateral dimensions in silicon integrated circuits decrease, the electronic behavior of the devices which comprise the circuit can be altered substantially. This is the case for a class of devices known as metal oxide semiconductor (MOS) transistors, that are widely used in today's industry. One of the primary problems in designing small MOS devices (those with the gate dimension less than 1 micrometer) is elimination of the hot carrier effect. In these short-channel devices, the electrons which traverse the channel become so energized that they tunnel into the oxide separating the crystalline silicon channel from the gate material. This phenomenon represents an important reliability problem for long term operation. The accepted method to reduce this effect is to grade the doping profile in the source/drain regions of the device from lightly-doped at the gate edge, to more heavily doped where electrical contact is made to the drain region. This reduces the electrical field at the drain of the transistor so that electrons cannot achieve high enough energies to be injected into the oxide.

Typically, formation of this graded profile is carried out in a two step process. In the first step, dopants are ion implanted with the gate structure in place. A light-dose implant is used so that the concentration is low. Next, an oxide layer is deposited in a conformal fashion over the entire structure. The oxide is then etched in an anisotropic manner, leaving a small oxide space at the edge of the gate. Another implant follows the etch step to introduce a large amount of dopants into the region where the device will be contacted by the metal interconnect.

The present invention simplifies this fabrication process by the use of pulsed laser energy in the dopant operation, thereby eliminating the intermediate oxide deposition and etch steps. As a result, the process of the present invention forms the graded doping profile for the source/drain in one step, with the distance between the heavily-doped and lightly-doped regions determined by the laser energy differential used to incorporate the dopants. The process of the present invention results in self-aligned lightly-doped-drains for short-channel MOS transistors, and reduces the number of processing steps, thus simplifying the manufacture of silicon integrated circuits which incorporate MOS transistors.

SUMMARY OF THE INVENTION

It is an object of the present invention to provide self-aligned lightly-doped-drain structures in MOS transistors.

A further object of the invention is to provide a process which simplifies the manufacture of silicon integrated circuits which incorporate MOS transistors.

A further object of the invention is to provide a self-aligned lightly-doped-drain structure for short-channel MOS transistors.

Another object of the invention is to provide an improved process for the formation of a graded doping profile in the source/drain regions of MOS transistors utilizing pulsed laser energy.

Another object of the invention is to provide a process for producing a graded doping profile for the source/drain regions which eliminates the conventional oxide deposition and etch steps.

Another object of the invention is to provide an improved method for fabricating self-aligned lightly-doped-drains for short-channel MOS transistors which involves a single high energy laser pulse for forming the lightly-doped-drain region, followed by a number of low energy laser pulses to heavily dope the source/drain silicon only in a very shallow region.

Other objects and advantages of the invention will become apparent from the following description and accompanying drawing. The present invention involves an improved process for fabricating lightly-doped-drains for short-channel MOS transistors, and results in a graded doping profile in the source/drain regions of the device using pulsed laser energy which eliminates the prior oxide deposition and etch step. In the present invention the graded doping profile for the source/drain is formed in one step, with the distance between the heavily-doped and lightly-doped regions being determined by the laser energy differential used to incorporate the dopants. By use of a single high energy laser pulse to melt the silicon to a significant depth, the amount of dopant incorporated into the silicon is small and diffuse to the edge of the gate structure. Next, many low energy laser pulses are used to heavily dope the source/drain silicon only in a very shallow region. Because of two-dimensional heat transfer at the MOS transistor gate edge, the low energy pulses are inset from the region initially doped by the high energy pulse, thus producing self-aligned lightly-doped-drain structures. The process of this invention can be used to simplify the manufacture of silicon integrated circuits which incorporate MOS transistors, thereby reducing costs or increasing profits.

BRIEF DESCRIPTION OF THE DRAWINGS

The accompanying drawings, which are incorporated into and form a part of the disclosure, illustrate an embodiment of the invention and, together with the description, serve to explain the principles of the invention.

DETAILED DESCRIPTION OF THE INVENTION

Figure 1:
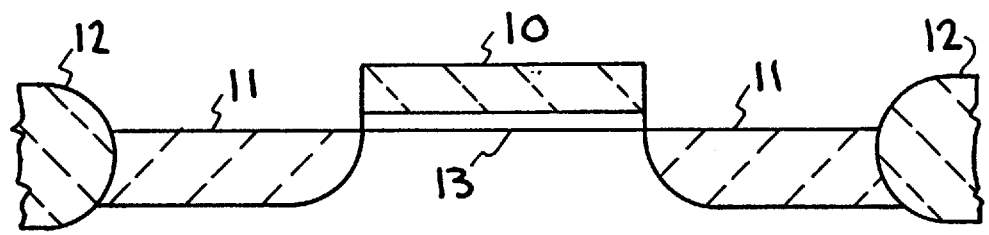
FIGS. 1 to 3 schematically illustrate an example of the process of the invention.

The present invention involves a process to fabricate self-aligned lightly-doped-drains for short-channel metal oxide semiconductor (MOS) transistors. The process utilizes pulsed laser energy to incorporate the dopants into the silicon. During the process, the silicon in the source/drain regions is melted by the laser energy. Impurities from a gas phase diffuse into the molten silicon to appropriately dope the source/drain regions. The gas immersion laser deposition (GILD) technique for doping silicon is known. See K. W. Weiner et al., IEEE, Electron Device Lett., 13, 369 (1992).

The process involves a single high energy pulse and a number of low energy pulses which produce the desired graded doping profile in the source/drain regions of the device from lightly-doped at the gate edge, to more heavily doped where electrical contact is made to the drain region. The single laser energy processing operation of the present process eliminates the prior used two step process involving the intermediate oxide deposition and etch steps, thus simplifying of manufacturing process.

This invention achieves a widely used lightly-doped-drain (LDD) structure in silicon integrated circuit processing in a manner that is much simpler than currently used techniques. Such LDD structures are used in virtually all submicrometer MOS transistor integrated circuit processing sequences. Using the process or technique of this invention, rather than current dopant implantation techniques, the LDD structure can be fabricated in a single processing step in a self-aligned fashion. To form the LDD region the process utilizes the two dimensional heat transfer around the gate region during the pulsed laser processing. Because silicon under the gate does not get as hot as silicon in the source drain regions, silicon near the edge of the gate does not melt until higher laser energies are utilized. Therefore, the process uses an initial high-energy laser pulse (energy in the range of 1.0 to 1.5 $J/cm^2$ for a pulsed length of 20 to 100 ns) which melts the silicon to a significant depth and incorporates a small amount of dopant at the gate edge. Furthermore, the dopants incorporated during this high energy pulse diffuse to the edge of the gate structure. Following this high energy laser pulse, a number of lower energy laser pulses (energy of 0.7 to 1.0 $J/cm^2$, pulse length of 20 to 50 ns, and pulse number of 10 to 500) are used to incorporate a large amount of dopants in the region where the source/drain regions will be contacted by future metallization. Because the process uses a lower energy for these doping pulses, the dopants are inset from the gate edge and the final doping profile is analogous to the graded doping profile of LDD structures achieved by currently used techniques.

The process of this invention, while utilizing a single high energy pulse and a number of lower energy pulses, is carried out in a single operational step by computer control of the laser to produce the desired energy levels, pulse length, and number of pulses for both the high and low energy pulses involved. By way of example, the laser for producing the desired high and low energy pulses may be selected from excimer lasers, copper vapor lasers, dye lasers, and YAG lasers, each of which are currently known in the art. A preferred excimer laser is an XeCl, but a KrF, ArI and XeF are capable.

Figure 2:
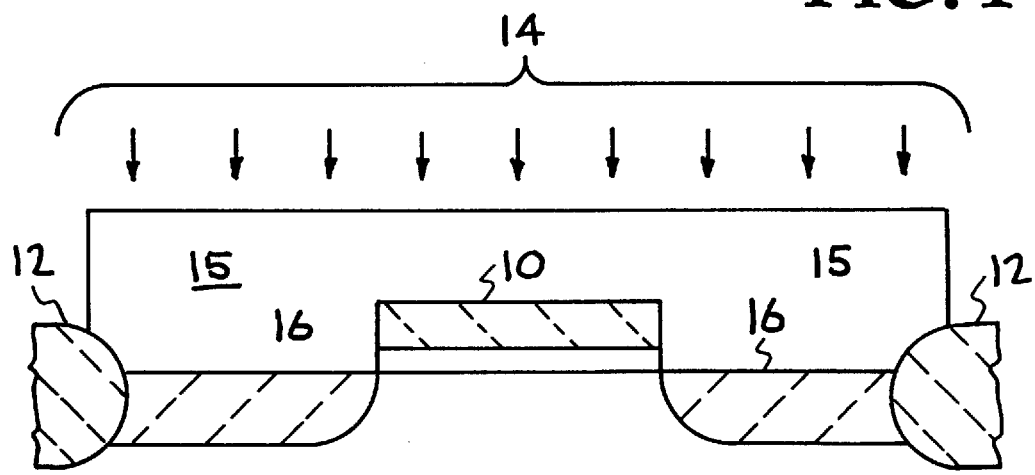
Figure 3:
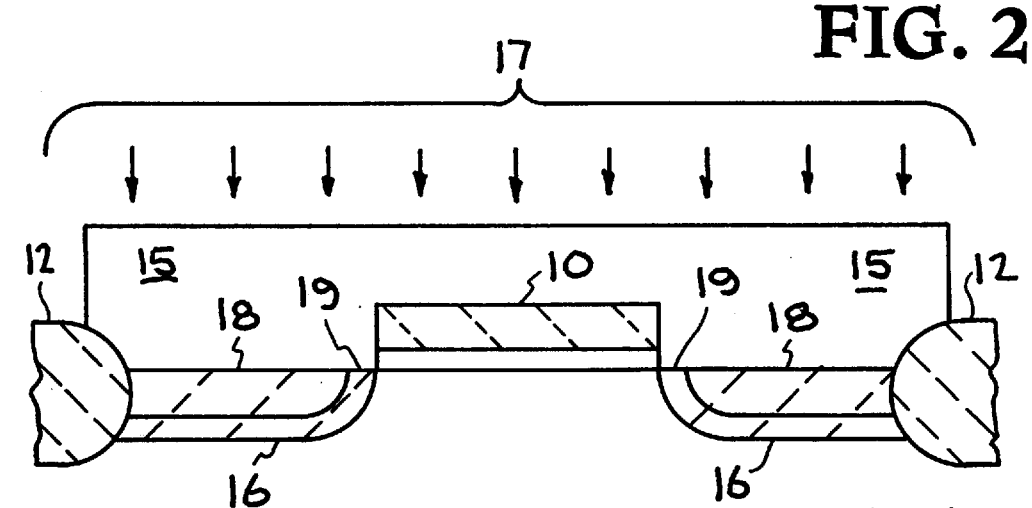
Figure 4:
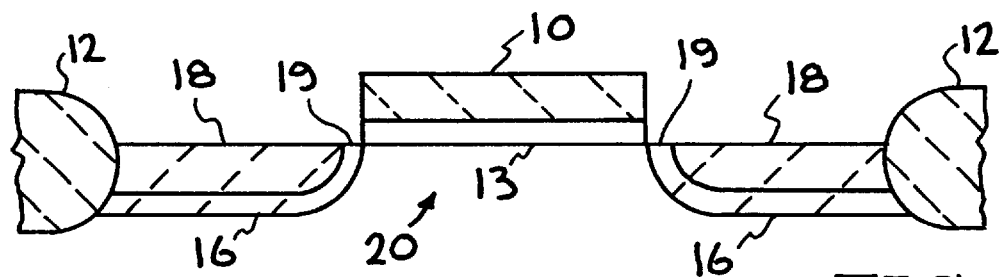
FIG. 4 schematically illustrates an embodiment of the invention made by the process of FIGS. 1–3.

The following sets forth a specific example of the process of the invention in conjunction with FIGS. 1–3:

1. A gate 10 is formed on a substrate, layer or wafer of undoped silicon 11, which is retained by supports 12 and which includes a thin center section 13 beneath the gate 10, as seen in FIG. 1.
2. A single pulse of high energy laser light, indicated at 14 is directed onto the undoped silicon 11 of FIG. 1 which is located in a dopant gas 15 at ambient temperature, whereby the silicon 11, except center section 13 is lightly doped, as indicated at 16, as shown in FIG. 2. For example, the laser energy 14 is provided by an Excimer laser having a wavelength of 308 nm, energy of 1.0 $j/cm^2$, and pulse duration of 35 ns, with the dopant being selected from boron, phosphorous, or arsenic containing gases, such as $BF_3$, $B_2H_6$, $PF_5$, $AsH_3$, or $AsF_5$. The energy of the single pulse may be in the range of 1.0 to 1.2 $J/cm^2$.
3. Following the single pulse of high energy laser light as shown in FIG. 2, a number of low energy laser light pulses, indicated at 17, are directed onto the lightly-doped silicon 16 of FIG. 2 while retained in the dopant gas 15 at ambient temperature, whereby a portion or region of the lightly-doped silicon 16 is heavily doped, (n*-doped) as indicated at 18 in FIG. 3. Note that the pulses of laser light energy 17 are controlled such that the heavily doped region 18 does not extend to the gate 10 so as to provide sidewall spacers 19. The completed LDD structure, generally indicated at 20 is shown in FIG. 4. By way of example, the pulses of laser light 17 may be produced by the above-described excimer laser, but with an energy of 0.7 $J/cm^2$, pulse duration of 35 ns, and number of pulses ranging from 10 to 200 depending on the extent of doping desired, varying from $10^{19}/cm^3$ to $10^{21}/cm^3$. The pulse energy may range from 0.7 to 1.0 $J/cm^2$.

It is thus seen that the present invention provides a self-aligned LDD source drain for MOS transistors utilizing a simplified process involving a single pulse of high energy in a dopant environment, followed by a number of lower energy pulses in the same dopant environment, whereby regions of the silicon substrate or wafer are lightly doped and heavily doped.

While a particular embodiment and specific operational sequence for producing the embodiment, as well as specific materials, parameters, energies, etc., have been set forth to exemplify and explain the principles of the invention, such are not intended to be limiting. Modifications and changes may become apparent to those skilled in the art, and it is intended that the invention be limited only by the scope of the appended claims.

What is claimed is:

1. A process for fabricating a LDD source drain, particularly adapted for MOS transistors, including:

providing a dopant atmosphere about a silicon member;

directing a single pulse of laser energy onto selected regions of the silicon member to produce lightly doped regions in the silicon member; and directing a number of laser pulses having energy lower than the single pulse onto selected regions of the silicon member to produce heavily doped regions in the silicon member.

2. The process of claim 1, wherein the single pulse of laser energy is in the range of 1.0 to 1.5 $J/cm^2$.

3. The process of claim 1, wherein the single pulse of laser energy is provided by a laser selected from the group of excimer, copper vapor, YAG, and dye.

4. The process of claim 1, wherein the single pulse of high laser energy has a duration of 20 to 100 ns.

5. The process of claim 1, wherein the single pulse of laser energy is produced by an excimer laser having a wavelength of 150 to 360 nm, energy of 1.0 to 1.5 $J/cm^2$, and pulse duration of 20 to 100 ns.

6. The process of claim 1, wherein the number of lower energy laser pulses have an energy in the range of 0.7 to 1.0 $J/cm^2$.

7. The process of claim 1, wherein the number of lower energy laser pulses are provided by the laser utilized to produce the single energy laser pulse.

8. The process of claim 1, wherein the lower energy laser pulses have an energy of 0.7 to 1.0 $J/cm^2$.

9. The process of claim 1, wherein the number of lower energy laser pulses is in the range of 10 to 500, with a duration of 20 to 100 ns.

10. The process of claim 1, wherein the dopant atmosphere is composed of gases containing boron, phosphorous, or arsenic.

11. A process for fabricating lightly-doped-drains for short-channel MOS transistors, comprising:

providing a silicon substrate;

providing the silicon substrate with a gate device;

providing a dopant atmosphere about the substrate;

converting regions of the silicon substrate to lightly doped silicon by directing a single pulse of energy onto the silicon substrate; and converting regions of the lightly doped silicon substrate to heavily doped silicon by directing a number of pulses having lower energy than the single pulse onto the lightly doped silicon.

12. The process of claim 11, wherein the single pulse and number of pulses are produced by a laser system.

13. The process of claim 12, wherein the single pulse has an energy of 1.0 to 1.5 $J/cm^2$, and wherein said number of pulses have an energy of 0.7 to 1.0 $J/cm^2$.

14. The process of claim 13, wherein the single pulse, has a time duration of 20 to 100 ns, and wherein said number of pulses each have a time duration of 20 to 100 ns.

15. The process of claim 14, wherein the number of pulses range from 10 to 500.

16. The process of claim 15, wherein the laser system is selected from the group of excimer, copper vapor, dye, and YAG lasers.

17. The process of claim 16, wherein the laser system is a excimer laser having a wavelength of 150 to 360 nm.

18. The process of claim 17, wherein the dopant atmosphere utilizes a dopant selected from the group consisting of boron, phosphorous, and arsenic.

* * * * *